US012414280B2

(12) United States Patent
Iwaki

(10) Patent No.: US 12,414,280 B2
(45) Date of Patent: Sep. 9, 2025

(54) SUBSTRATE WORKING MACHINE

(71) Applicant: FUJI CORPORATION, Chiryu (JP)

(72) Inventor: Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 413 days.

(21) Appl. No.: 17/906,308

(22) PCT Filed: Mar. 19, 2020

(86) PCT No.: PCT/JP2020/012266
§ 371 (c)(1),
(2) Date: Sep. 14, 2022

(87) PCT Pub. No.: WO2021/186666
PCT Pub. Date: Sep. 23, 2021

(65) Prior Publication Data
US 2023/0093351 A1 Mar. 23, 2023

(51) Int. Cl.
H05K 13/08 (2006.01)
B25J 9/16 (2006.01)
B25J 13/08 (2006.01)
G06T 7/50 (2017.01)
G06T 7/70 (2017.01)
H05K 13/00 (2006.01)
H05K 13/04 (2006.01)

(52) U.S. Cl.
CPC ........ H05K 13/0812 (2018.08); B25J 9/1687 (2013.01); B25J 9/1697 (2013.01); B25J 13/08 (2013.01); G06T 7/50 (2017.01); G06T 7/70 (2017.01); H05K 13/0069 (2013.01); G06T 2207/30141 (2013.01)

(58) Field of Classification Search
None
See application file for complete search history.

(56) References Cited

FOREIGN PATENT DOCUMENTS

| JP | 01238197 A | * | 9/1989 |
| JP | 05180780 A | * | 7/1993 |
| JP | 2003092498 A | * | 3/2003 |
| JP | 2020034418 A | * | 3/2020 |

OTHER PUBLICATIONS

English machine translation of JP01238197A (Year: 1989).*
English machine translation of JP05180780A (Year: 1993).*
JP2003092498A Machine English Translation (Year: 2025).*
JP2020034418A Machine English Translation (Year: 2025).*
International Search Report Issued Apr. 28, 2020, in PCT/JP2020/012266, filed on Mar. 19, 2020, 2 pages.

* cited by examiner

Primary Examiner — Thomas E Worden
Assistant Examiner — Atticus A Cameron
(74) Attorney, Agent, or Firm — Oblon, McClelland, Maier &Neustadt, L.L.P.

(57) ABSTRACT

Provided is a substrate working machine including a holding device configured to hold a substrate in which multiple through-holes are formed, an inserting device configured to insert multiple terminals of a component into the multiple through-holes of the substrate held by the holding device, and an imaging device configured to simultaneously image a shape of a pair of pins and a pair of through-holes of the multiple through-holes, in which positions of the pair of through-holes and the shape of the pair of pins are calculated based on image data captured by the imaging device.

3 Claims, 14 Drawing Sheets

SUBSTRATE WORKING MACHINE

TECHNICAL FIELD

The present disclosure relates to a substrate working machine for inserting multiple terminals of a component into multiple through-holes formed in a substrate.

BACKGROUND ART

In the following Patent Literature, a substrate working machine for inserting multiple terminals of a component into multiple through-holes formed in a substrate is described.

PATENT LITERATURE

Patent Literature 1: JP-A-H1-238197

BRIEF SUMMARY

Technical Problem

An object of the present specification is to insert multiple terminals of a component into multiple through-holes formed in a substrate.

Solution to Problem

In order to solve the above-mentioned problems, the present specification discloses a substrate working machine including a holding device configured to hold a substrate in which multiple through-holes are formed, an inserting device configured to insert multiple terminals of a component into the multiple through-holes of the substrate held by the holding device, and an imaging device configured to simultaneously image a shape of a pair of pins and a pair of through-holes of the multiple through-holes, in which positions of the pair of through-holes and the shape of the pair of pins are calculated based on image data captured by the imaging device.

Advantageous Effects

In the case of the substrate working machine of the present disclosure, the shape of the pair of pins and the pair of through-holes are simultaneously imaged and the positions of the pair of through-holes and the shape of the pair of pins are calculated based on the captured image data thereof. As a result, for example, it is possible to appropriately insert the multiple terminals into the multiple through-holes by calculating the positions of the pair of through-holes and the shape of the pair of pins based on the positions of the pair of through-holes and the shape of the pair of pins.

DESCRIPTION OF EMBODIMENTS

Hereinafter, exemplary embodiments of the present disclosure will be described in detail with reference to drawings.

Figure 1:
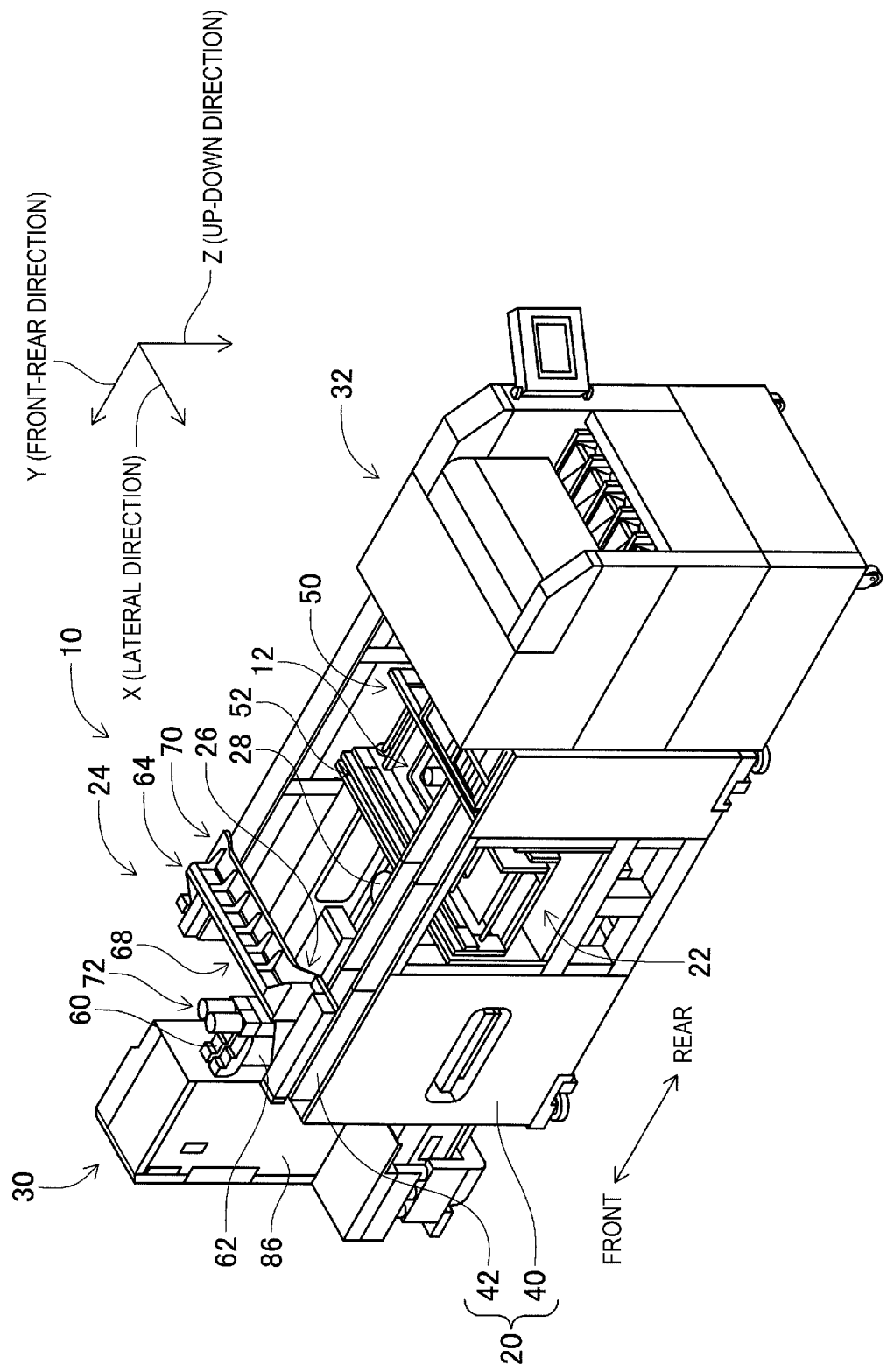
FIG. 1 is a perspective view showing a component mounter.

FIG. 1 shows component mounter 10. Component mounter 10 is a device that performs a component mounting operation on circuit base material 12. Component mounter 10 includes device main body 20, base material conveyance and holding device 22, component mounting device 24, mark camera 26, part camera 28, component supply device 30, bulk component supply device 32, cut-and-clinch unit (refer to FIG. 5) 34, unit moving device (refer to FIG. 4) 36, and control device (refer to FIG. 7) 38. Examples of circuit base material 12 include a circuit substrate, a substrate having a three-dimensional structure, and the like, and examples of a circuit substrate include a printed wiring board, a printed circuit board, and the like.

Device main body 20 is composed of frame 40 and beam 42 suspended on frame 40. Base material conveyance and holding device 22 is disposed at the center of frame 40 in a front-rear direction, and has conveyance device 50 and clamp device 52. Conveyance device 50 is a device for conveying circuit base material 12, and clamp device 52 is a device for holding circuit base material 12. As a result, base material conveyance and holding device 22 conveys circuit base material 12 and fixedly holds circuit base material 12 at a predetermined position. In the description below, the conveyance direction of circuit base material 12 will be referred to as an X-direction, a horizontal direction perpendicular to the X-direction will be referred to as a Y-direction, and a vertical direction will be referred to as a Z-direction. That is, the width direction of component mounter 10 is the X-direction, and the front-rear direction is the Y-direction.

Component mounting device 24 is disposed on beam 42 and includes two work heads 60 and 62 and work head moving device 64. Work head moving device 64 includes X-direction moving device 68, Y-direction moving device 70, and Z-direction moving devices 72. In addition, two work heads 60 and 62 are integrally moved to any position on frame 40 by X-direction moving device 68 and Y-direction moving device 70. In addition, each of work heads 60 and 62 is positioned and mounted on sliders 74 and 76 such that each of work heads 60 and 62 can be detached and attached by a worker without using any tool, and Z-direction moving devices 72 individually move sliders 74 and 76 in an up-down direction. That is, work heads 60 and 62 are moved in the up-down direction individually by Z-direction moving devices 72.

Figure 2:
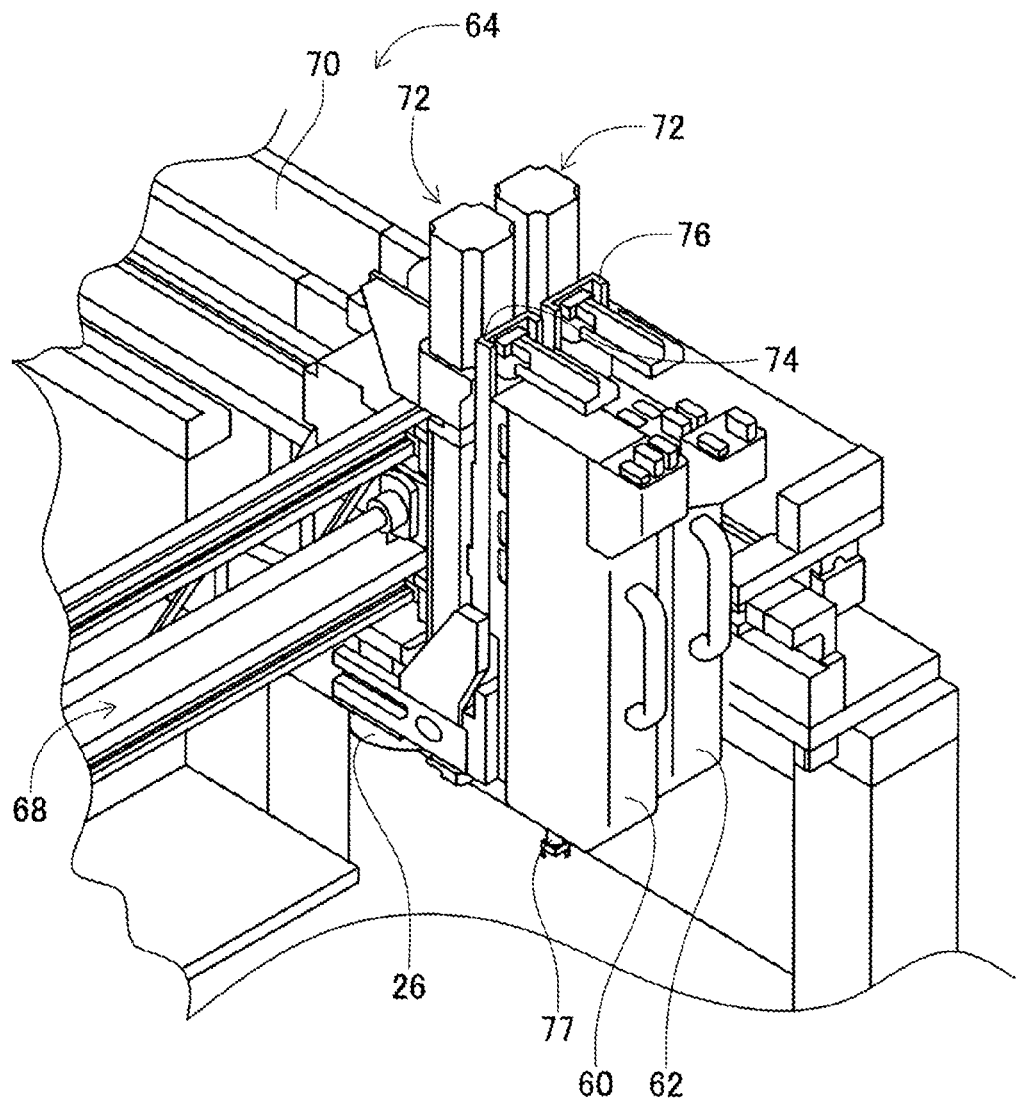
FIG. 2 is a perspective view showing a component mounting device.
Figure 3:
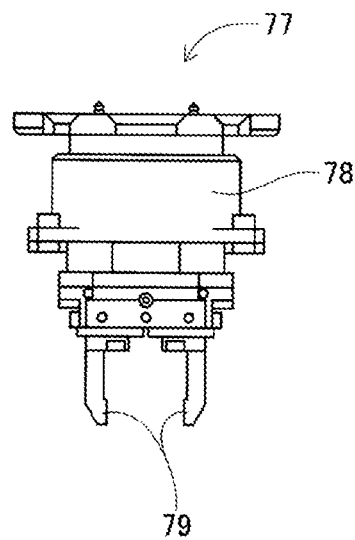
FIG. 3 is a view showing a component holding tool.

In addition, as illustrated in FIG. 2, component holding tool 77 is attached to a lower end surface of each of work heads 60 and 62. Component holding tool 77 is a so-called chuck, and includes main body 78 and pair of claws 79 as illustrated in FIG. 3. Pair of claws 79 is disposed to extend downwards from a lower surface of main body 78 and linearly slides to move to and away from each other. As a result, component holding tool 77 holds a component with pair of claws 79 by causing pair of claws 79 to move to each other, and releases the component from between pair of claws 79 by causing pair of claws 79 to move away from each other. In addition, each of work heads 60 and 62 is provided with a rotation device (not illustrated) that rotates component holding tool 77 around the vertical axis, so that the posture of a component held by component holding tool 77 can be changed by means of the operation of the rotation device.

Mark camera 26 is attached to slider 74 in a state of facing downward on the vertical line as illustrated in FIG. 2, and mark camera 26 moves together with work head 60 in the X-direction, the Y-direction, and the Z-direction. As a result, mark camera 26 images any position on frame 40. As illustrated in FIG. 1, part camera 28 is disposed between base material conveyance and holding device 22 on frame 40 and component supply device 30 in a state of facing upward on the vertical line. As a result, part camera 28 images components held by component holding tools 77 of work heads 60 and 62.

Component supply device 30 is disposed at a first end portion of frame 40 in the front-rear direction. Component supply device 30 includes tray-type component supply device 86 and feeder-type component supply device (refer to FIG. 6) 88. Tray-type component supply device 86 is a device that supplies a component in a state in which the component is placed on a tray. Feeder-type component supply device 88 is a device that supplies a component by using a tape feeder or a stick feeder (not illustrated).

Bulk component supply device 32 is disposed at a second end portion of frame 40 in the front-rear direction. Bulk component supply device 32 is a device that aligns multiple components in a scattered state and supplies the components in an aligned state. That is, bulk component supply device 32 is a device that aligns multiple components in any posture to a predetermined posture, and supplies the components of the predetermined posture.

Examples of components which are supplied by component supply device 30 and bulk component supply device 32 include electronic circuit components, constituent components of a solar cell, constituent components of a power module, and the like. In addition, the electronic circuit components include a component with a lead, a component without a lead, and the like.

Figure 5:
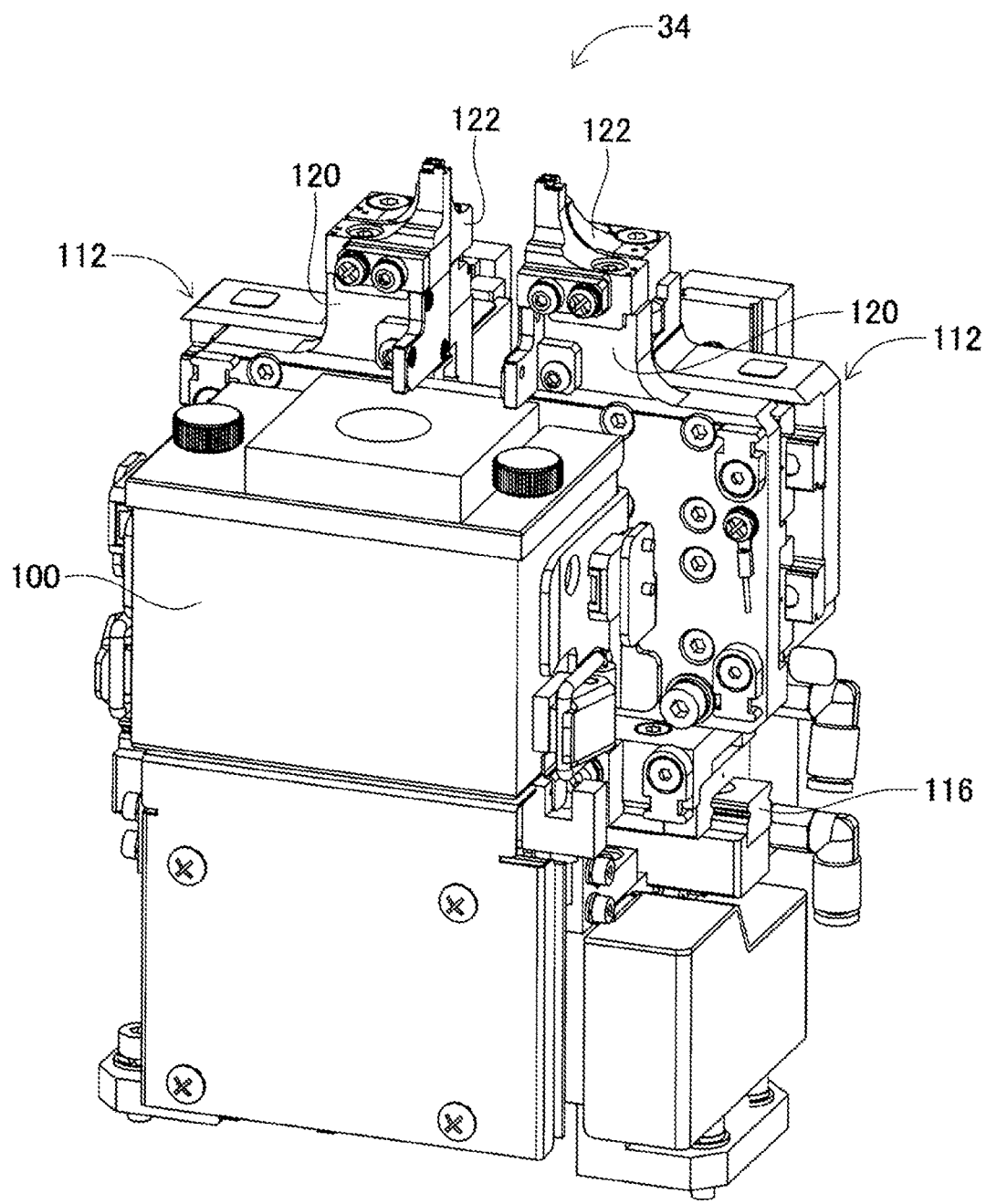
FIG. 5 is a perspective view showing the cut-and-clinch unit.
Figure 5:
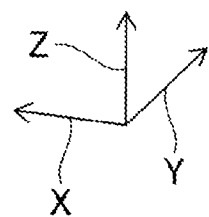

Cut-and-clinch unit 34 and unit moving device 36 are disposed below conveyance device 50. Cut-and-clinch unit 34 can be moved to any position below conveyance device 50 by unit moving device 36. Cut-and-clinch unit 34 is a device for cutting and bending leads (refer to FIG. 6) 108 of lead component (refer to FIG. 6) 106 that are inserted into through-holes 104 formed in circuit base material 12 (refer to FIG. 6). As illustrated in FIG. 5, cut-and-clinch unit 34 includes pair of sliding bodies 112. Pair of sliding bodies 112 are slidably supported by slide rail 116 disposed to extend in the X-direction. With this configuration, pair of sliding bodies 112 moves to and away from each other in the X-direction. In addition, the distance between pair of sliding bodies 112 is controllably changed by the driving of electromagnetic motor (refer to FIG. 7) 118.

In addition, each of pair of sliding bodies 112 includes fixed portion 120 and movable portion 122 and is slidably held by slide rail 116 at fixed portion 120. In addition, movable portion 122 is held by fixed portion 120 to be slidable in the X-direction. In addition, movable portion 122 is controllably slid in the X-direction with respect to fixed portion 120 by the driving of electromagnetic motor (refer to FIG. 7) 128.

Figure 6:
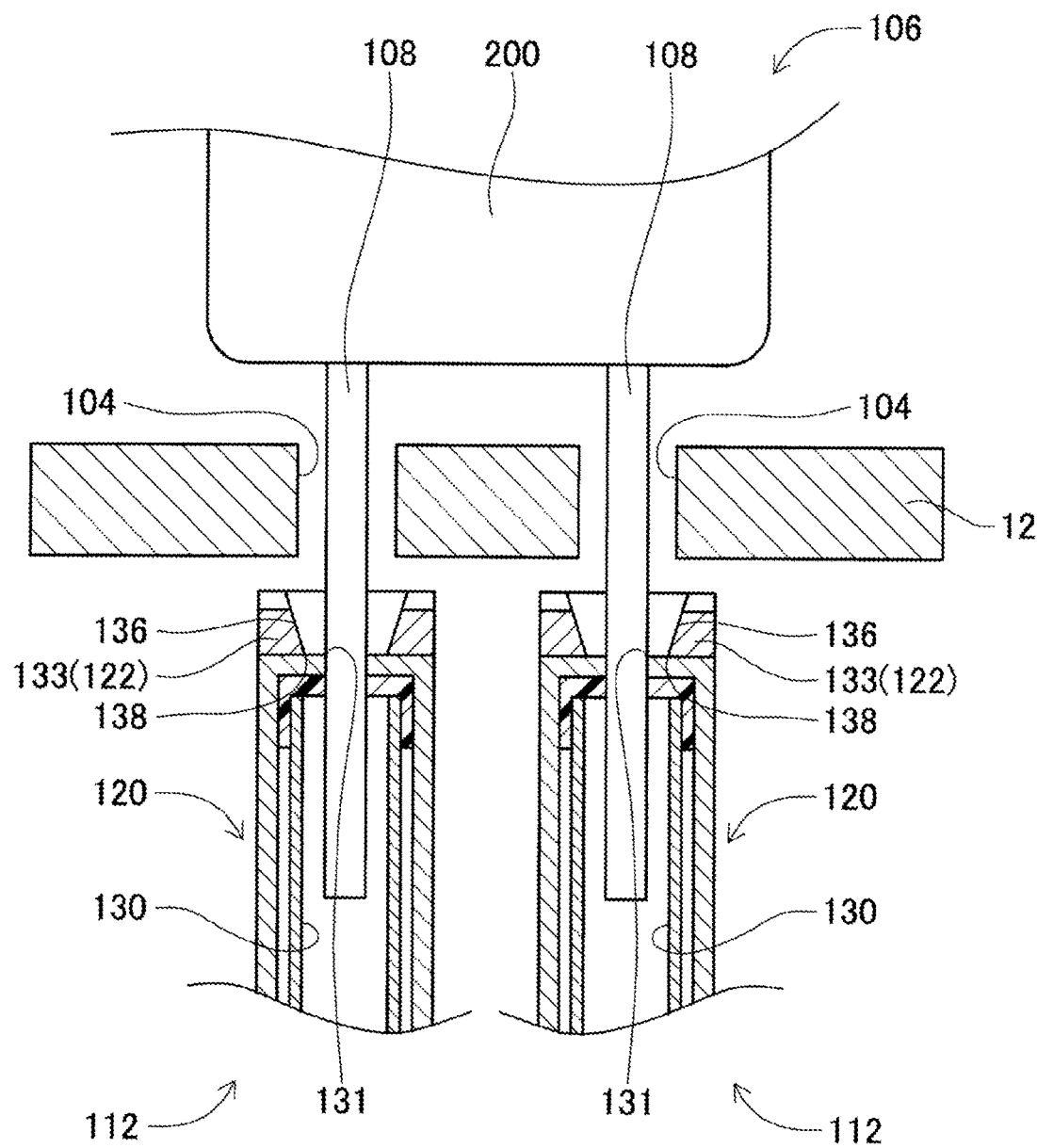
FIG. 6 is a schematic view showing the cut-and-clinch unit during the cutting and bending of leads of a lead component.

In addition, as illustrated in FIG. 6, an upper end portion of fixed portion 120 has a tapered shape, and first insertion hole 130 is formed to penetrate the upper end portion in the up-down direction. In addition, an opening edge of first insertion hole 130 at an upper end surface is fixed blade 131. Meanwhile, an upper end portion of movable portion 122 also has a tapered shape, and bent portion 133, which is bent into an L-shape, is formed at the upper end portion. Bent portion 133 extends above an upper end surface of fixed portion 120. In addition, first insertion hole 130, which is open at the upper end surface of fixed portion 120, is covered by bent portion 133, and second insertion hole 136 is formed in bent portion 133 such that second insertion hole 136 faces first insertion hole 130. Note that an opening edge of second insertion hole 136 at a lower end surface of bent portion 133 is movable blade 138.

Figure 4:
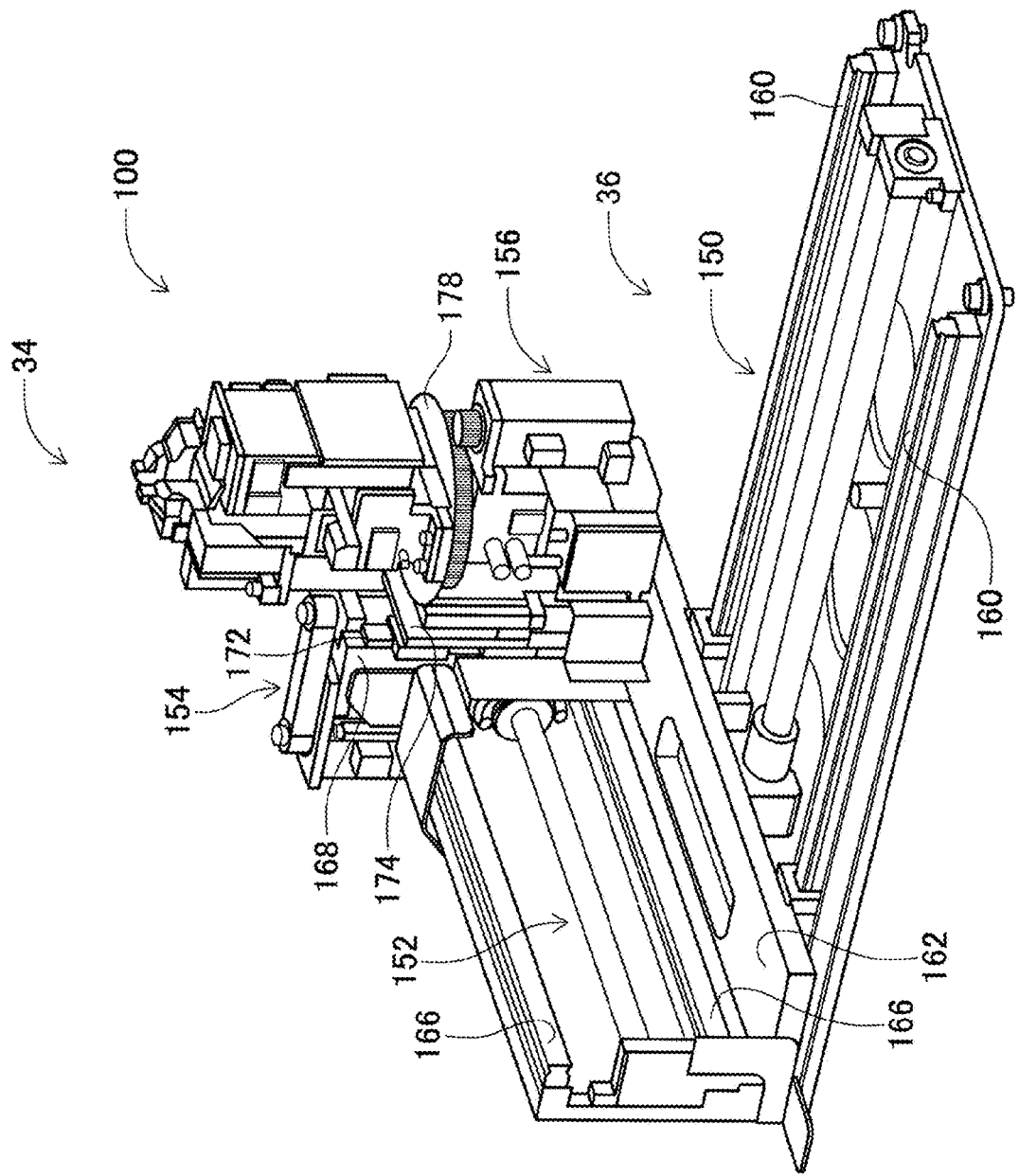
FIG. 4 is a perspective view showing a cut-and-clinch unit and a unit moving device.

In addition, unit moving device 36, as illustrated in FIG. 4, includes X-direction moving device 150, Y-direction moving device 152, Z-direction moving device 154, and rotation device 156. X-direction moving device 150 includes slide rails 160 and X-slider 162. Slide rails 160 are disposed to extend in the X-direction, and X-slider 162 is slidably held by slide rails 160. In addition, X-slider 162 moves in the X-direction by the driving of electromagnetic motor (refer to FIG. 7) 164. Y-direction moving device 152 includes slide rails 166 and Y-slider 168. Slide rails 166 are disposed on X-slider 162 to extend in the Y-direction, and Y-slider 168 is slidably held by slide rails 166. In addition, Y-slider 168 moves in the Y-direction by the driving of electromagnetic motor (refer to FIG. 7) 170. Z-direction moving device 154 includes slide rails 172 and Z-slider 174. Slide rails 172 are disposed on Y-slider 168 to extend in the Z-direction, and Z-slider 174 is slidably held by slide rails 172. In addition, Z-slider 174 moves in the Z-direction by the driving of electromagnetic motor (refer to FIG. 7) 176.

In addition, rotation device 156 includes rotary table 178 having a substantially circular disc-like shape. Rotary table 178 is supported on Z-slider 174 such that rotary table 178 can rotate around a vertical axis thereof and rotates by the driving of electromagnetic motor (refer to FIG. 7) 180. In addition, on rotary table 178, cut-and-clinch unit 34 is positioned and disposed such that cut-and-clinch unit 34 can be detached and attached through a one-touch action performed by a worker without using any tool. With such a structure, cut-and-clinch unit 34 is moved to any position between a pair of conveyance lanes of base material conveyance and holding device 22, which is for conveyance of circuit base material 12, by X-direction moving device 150, Y-direction moving device 152, and Z-direction moving device 154 and is rotated to any angle by rotation device 156. As a result, cut-and-clinch unit 34 can be positioned at any position below circuit base material 12 held by clamp device 52.

Figure 7:
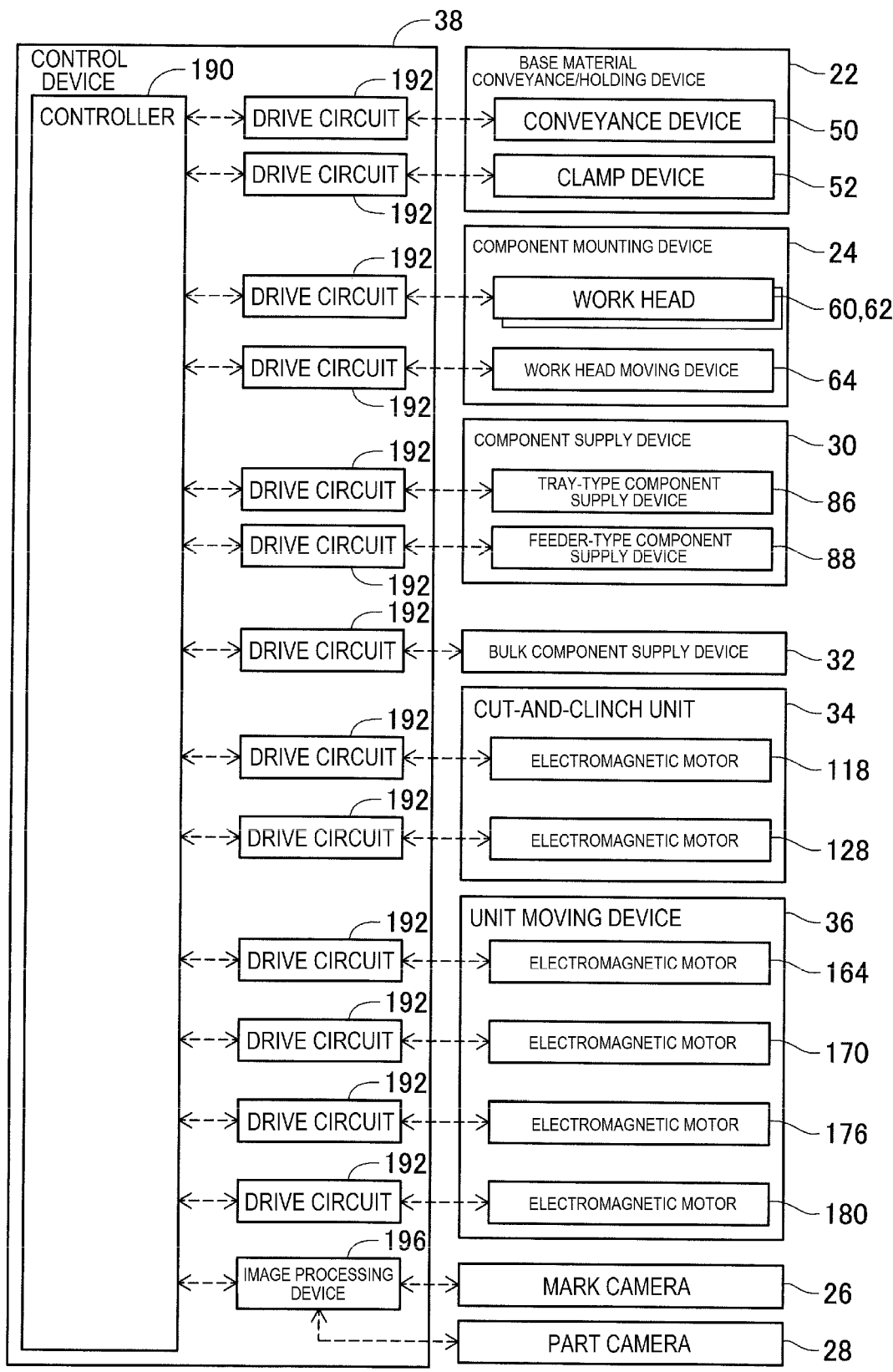
FIG. 7 is a block diagram showing a control device.

As illustrated in FIG. 7, control device 38 includes controller 190, multiple drive circuits 192, and image processing device 196. Multiple drive circuits 192 are connected to conveyance device 50, clamp device 52, work heads 60 and 62, work head moving device 64, tray-type component supply device 86, feeder-type component supply device 88, bulk component supply device 32, and electromagnetic motors 118, 128, 164, 170, 176, and 180, which are described above. Controller 190 includes a CPU, a ROM, a RAM, and the like, is mainly composed of a computer, and is connected to multiple drive circuits 192. As a result, the operations of base material conveyance and holding device 22, component mounting device 24, and the like are controlled by controller 190. Furthermore, controller 190 is also connected to image processing device 196. Image processing device 196 is a device that processes image data obtained by mark camera 26 and part camera 28, and controller 190 acquires various pieces of information from the image data.

With the configuration as described above, component mounter 10 performs a component mounting operation on circuit base material 12 held by base material conveyance and holding device 22. Although component mounter 10 can mount various types of components on circuit base material 12, a case where lead component 106 is mounted on circuit base material 12 will be described below.

Specifically, circuit base material 12 is conveyed to a work position by conveyance device 50 of base material conveyance and holding device 22 and is fixedly held by clamp device 52 at the position. Next, mark camera 26 moves to a position above circuit base material 12 and images circuit base material 12. As a result, information on the holding position of circuit base material 12 and the like is obtained. In addition, component supply device 30 or bulk component supply device 32 supplies lead component 106 to work heads 60 and 62 at a predetermined supply position. Then, any of work heads 60 and 62 moves to a position above a component supply position and component main body (refer to FIG. 6) 200 of lead component 106 is gripped by pair of claws 79 of component holding tool 77.

Subsequently, work heads 60 and 62 holding the lead component 106 move to positions above part camera 28, and part camera 28 images lead component 106 held by pair of claws 79 of component holding tool 77. As a result, information on the holding position of the component and the like is obtained. Subsequently, work heads 60 and 62 holding lead component 106 move to positions above circuit base material 12 and errors of the holding position of circuit base material 12, errors of the holding position of the component, and the like are corrected. Then, leads 108 of lead component 106 held by component holding tool 77 are inserted into through-holes 104 formed in circuit base material 12. At this time, cut-and-clinch unit 34 is moved to a position below circuit base material 12.

Specifically, in cut-and-clinch unit 34, the distance between pair of sliding bodies 112 is moved and positioned by the operation of electromagnetic motor 118 such that the distance between second insertion holes 136 of pair of sliding bodies 112 is the same as the distance between two through-holes 104 formed in circuit base material 12. In addition, rotation device 156 is operated and positioned such that the direction of alignment of two through-holes 104 of circuit base material 12 coincides with the direction of alignment of two second insertion holes 136 of pair of sliding bodies 112.

Then, X-direction moving device 150 and Y-direction moving device 152 are operated and cut-and-clinch unit 34 is moved and positioned such that the XY-direction coordinates of second insertion holes 136 coincide with the XY-direction coordinates of through-holes 104 of circuit base material 12. As a result, cut-and-clinch unit 34 is moved along the XY-directions and second insertion holes 136 of sliding bodies 112 and through-holes 104 of circuit base material 12 are positioned in a state of overlapping with each other in the up-down direction.

Next, cut-and-clinch unit 34 is raised and positioned by the operation of Z-direction moving device 154 such that an upper surface of movable portion 122 comes into contact with a lower surface of circuit base material 12 or is positioned slightly lower than the lower surface of circuit base material 12. As described above, the operations of X-direction moving device 150, Y-direction moving device 152, Z-direction moving device 154, and rotation device 156 are controlled such that cut-and-clinch unit 34 is positioned below circuit base material 12 in a state where second insertion holes 136 of sliding bodies 112 and through-holes 104 of circuit base material 12 overlap with each other.

In addition, in a case where leads 108 of lead component 106 held by component holding tool 77 are inserted into through-holes 104 of circuit base material 12, distal end portions of leads 108 are inserted into first insertion holes 130 of fixed portions 120 via second insertion holes 136 of movable portions 122 of cut-and-clinch unit 34, as illustrated in FIG. 6. Next, in a case where the distal end portions of leads 108 are inserted into first insertion holes 130 of fixed portions 120, movable portions 122 of pair of sliding bodies 112 slide away from each other by the operation of electromagnetic motor 128. As a result, leads 108 are cut by fixed blades 131 of first insertion holes 130 and movable blades 138 of second insertion holes 136.

In addition, pair of movable portions 122 further slides away from each other even after leads 108 are cut. Therefore, new distal end portions of leads 108 due to the cutting are bent as movable portions 122 slide. As a result, pair of leads 108 is bent away from each other, so that lead component 106 is mounted on circuit base material 12 in a state where leads 108 are prevented from coming out of through-holes 104.

As described above, in component mounter 10, leads 108 of lead component 106 are inserted into through-holes 104 of circuit base material 12, and distal ends of leads 108 are cut and bent by cut-and-clinch unit 34. Therefore, although it is desired to suitably insert leads 108 into through-holes 104 of circuit base material 12, a method of improving the insertion accuracy has not been established in a conventional component mounter. Therefore, in the case of component mounter 10, a jig provided on which pins are formed is used and the pins of the jig held by work heads 60 and 62 are inserted into the through-holes of circuit base material 12 so that the accuracy of insertion of the leads of the lead component into the through-holes of the circuit base material is improved based on imaging data of the through-holes obtained in a state where the pins are inserted.

Figure 8:
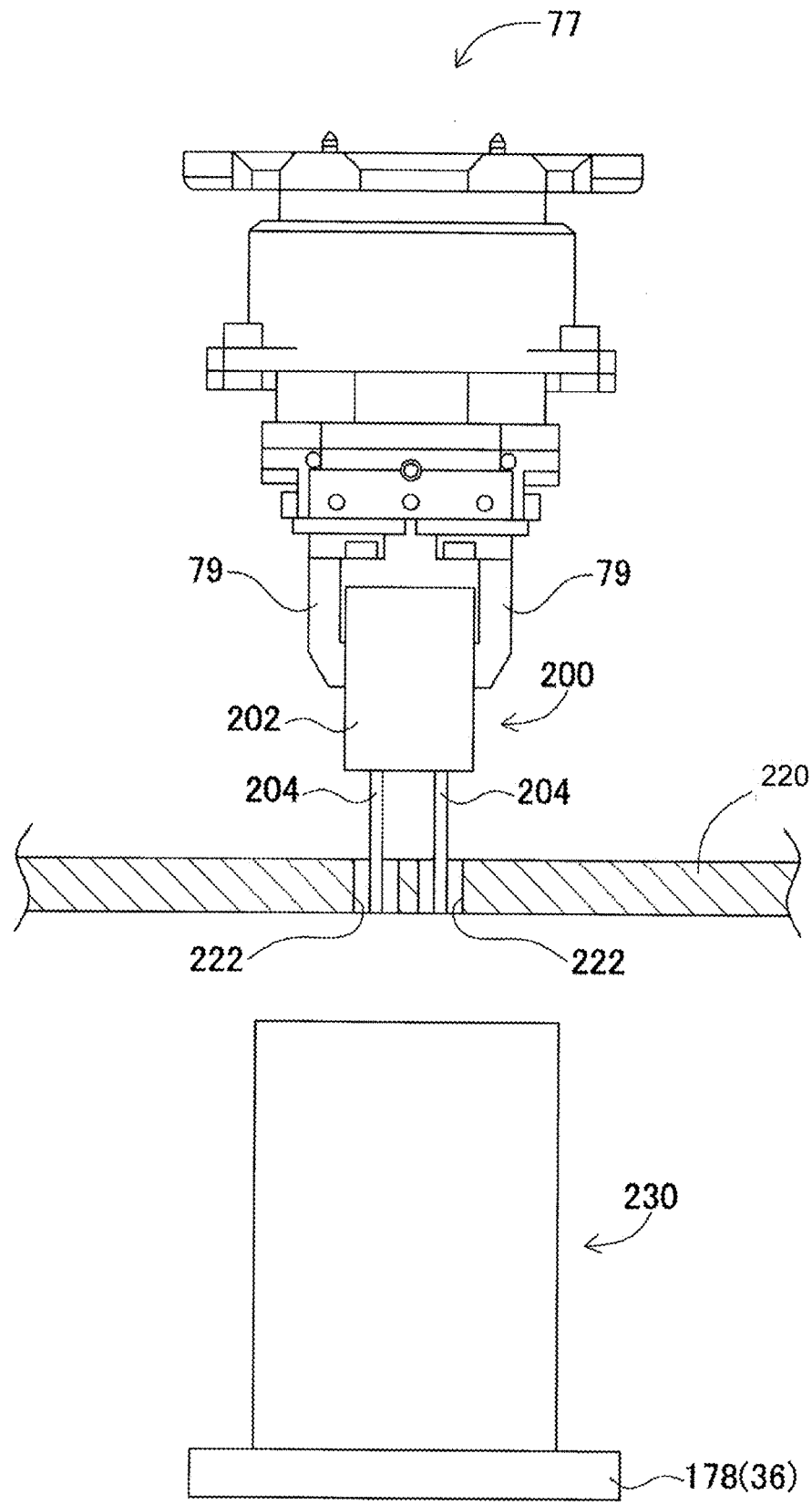
FIG. 8 is a schematic view showing a state where a through-hole with pins inserted thereinto is imaged by an imaging device.

Specifically, as illustrated in FIG. 8, jig 200 is composed of component main body 202 and pair of pins 204. Component main body 202 is substantially block-shaped, and pair of pins 204 extends linearly and vertically from the bottom surface of component main body 202 in the same direction. Pair of pins 204 is standardized, and the pitch, the outer diameter, the length dimension, and the like of the pins 204 are set in advance. In other words, standardized pair of pins 204 extends in the vertical direction from a surface of component main body 202 with high accuracy and the accuracy is secured. In addition, component main body 202 of jig 200 is clamped by pair of claws 79 of component holding tool 77, so that jig 200 is held by component holding tool 77.

Figure 9:
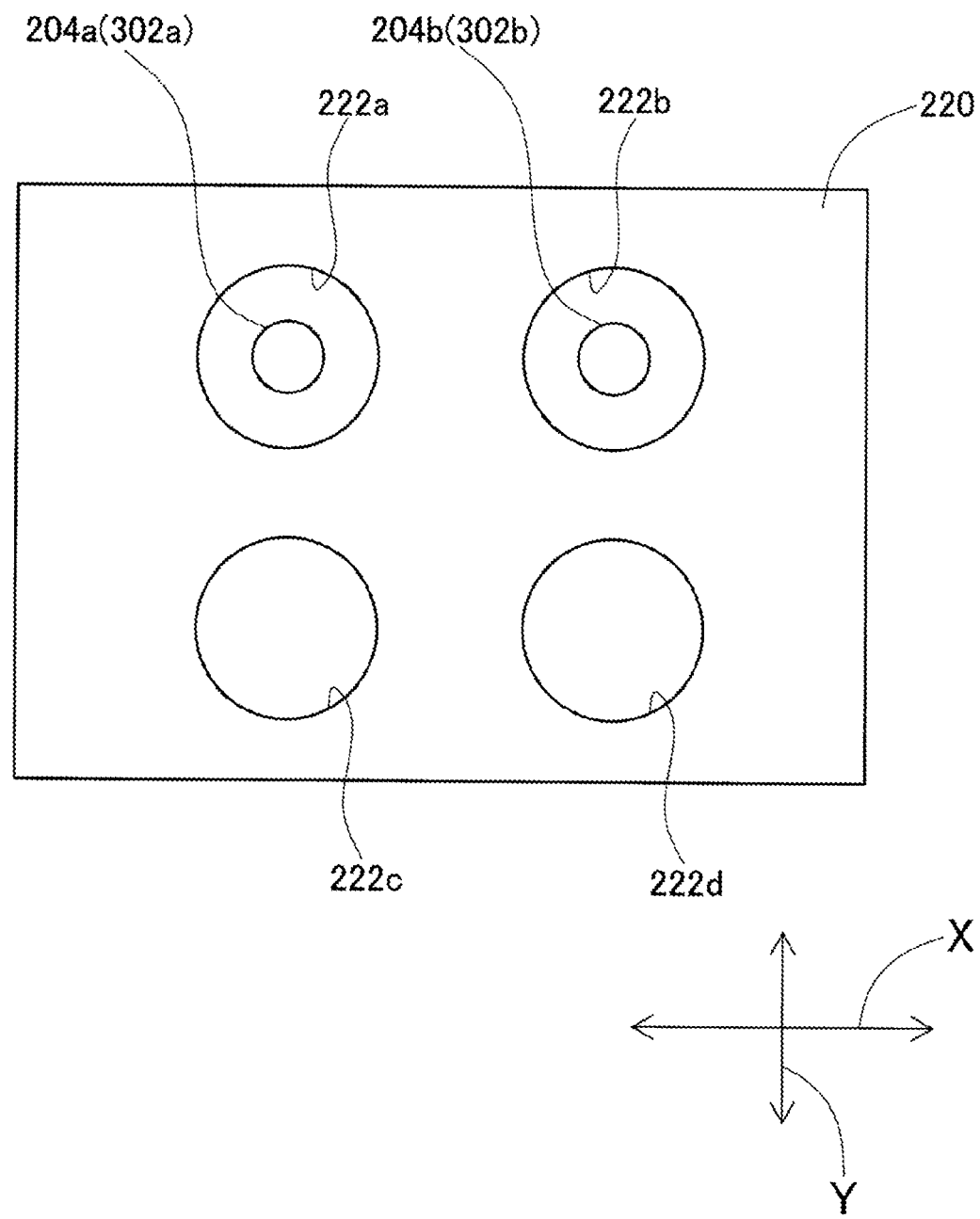
FIG. 9 is a captured image of a through-hole with pins inserted thereinto.

In addition, substrate 220 serving as a jig used for jig 200 is also prepared. As illustrated in FIG. 9, four through-holes 222 are formed in substrate 220, and four through-holes 222 are arranged in two rows and two columns. Four through-holes 222 are also standardized, and the pitch of two of four through-holes 222 that are adjacent to each other, the inner diameters of the through-holes 222, and the like are accurately processed to be dimensions set in advance. Note that the pitch of two of four through-holes 222 that are adjacent to each other and the pitch of pair of pins 204 of jig 200 are processed to be the same as each other. Incidentally, the pitch of two through-holes 222 is the distance between the center of first through-hole 222 and the center of second through-hole 222, and the pitch of pair of pins 204 is the distance between the center of an end surface of first pin 204 and the center of an end surface of second pin 204. In addition, the inner diameter of through-hole 222 is approximately three times the outer diameter of pin 204.

Substrate 220 having such a structure is conveyed to a work position by conveyance device 50 and is clamped at the work position by clamp device 52. Then, substrate 220 positioned and fixed is imaged by mark camera 26, and the position of each through-hole 222 is calculated based on the imaging data thereof. In addition, jig 200 held by component holding tool 77 is imaged by part camera 28, and the position of the pair of pins is calculated based on the imaging data thereof. Then, work heads 60 and 62 are moved by the operation of work head moving device 64 such that pair of pins 204 coincides with two of four through-holes 222 in the up-down direction, that is, the XY-coordinates of pair of pins 204 coincide with the XY-coordinates of two through-holes 222. Subsequently, work heads 60 and 62 are lowered by the operation of work head moving device 64, so that pair of pins 204 is inserted into two through-holes 222 as illustrated in FIG. 8. At this time, work heads 60 and 62 are lowered such that end surfaces of pins 204 and a lower surface of substrate 220 coincide with each other in the up-down direction, that is, the end surfaces of pins 204 and the lower surface of substrate 220 are flush with each other.

In addition, on a lower surface side of substrate 220, one imaging device 230 is attached to rotary table 178 of unit moving device 36 instead of cut-and-clinch unit 34 attached thereto. As described above, the cut-and-clinch unit 34 can be positioned, detached from, and attached to rotary table 178 through a one-touch action performed by a worker without using any tool and imaging device 230 is also attachably and detachably attached to rotary table 178, from which cut-and-clinch unit 34 has been removed, in a state of being positioned while facing upward on the vertical line. Then, imaging device 230 attached to rotary table 178 is moved to a position below through-holes 222 of substrate 220 by the operation of unit moving device 36.

Therefore, pair of pins 204 inserted into two through-holes 222 of substrate 220 is imaged by imaging device 230. That is, pair of pins 204 and two through-holes 222 with pair of pins 204 inserted thereinto are simultaneously imaged by imaging device 230. Note that imaging device 230 is a two-dimensional imaging device including an imaging element in which cells are two-dimensionally arranged and images a three-dimensional object to obtain a two-dimensional image. Therefore, the depth of field of imaging device 230 is relatively narrow. Therefore, as described above, lower end surfaces of pins 204 inserted into through-holes 222 and the lower surface of substrate 220 are made flush with each other and are positioned within the depth of field of the imaging device, so that an appropriate captured image of the lower end surfaces of pins 204 and through-holes 222 is acquired.

Figure 10:
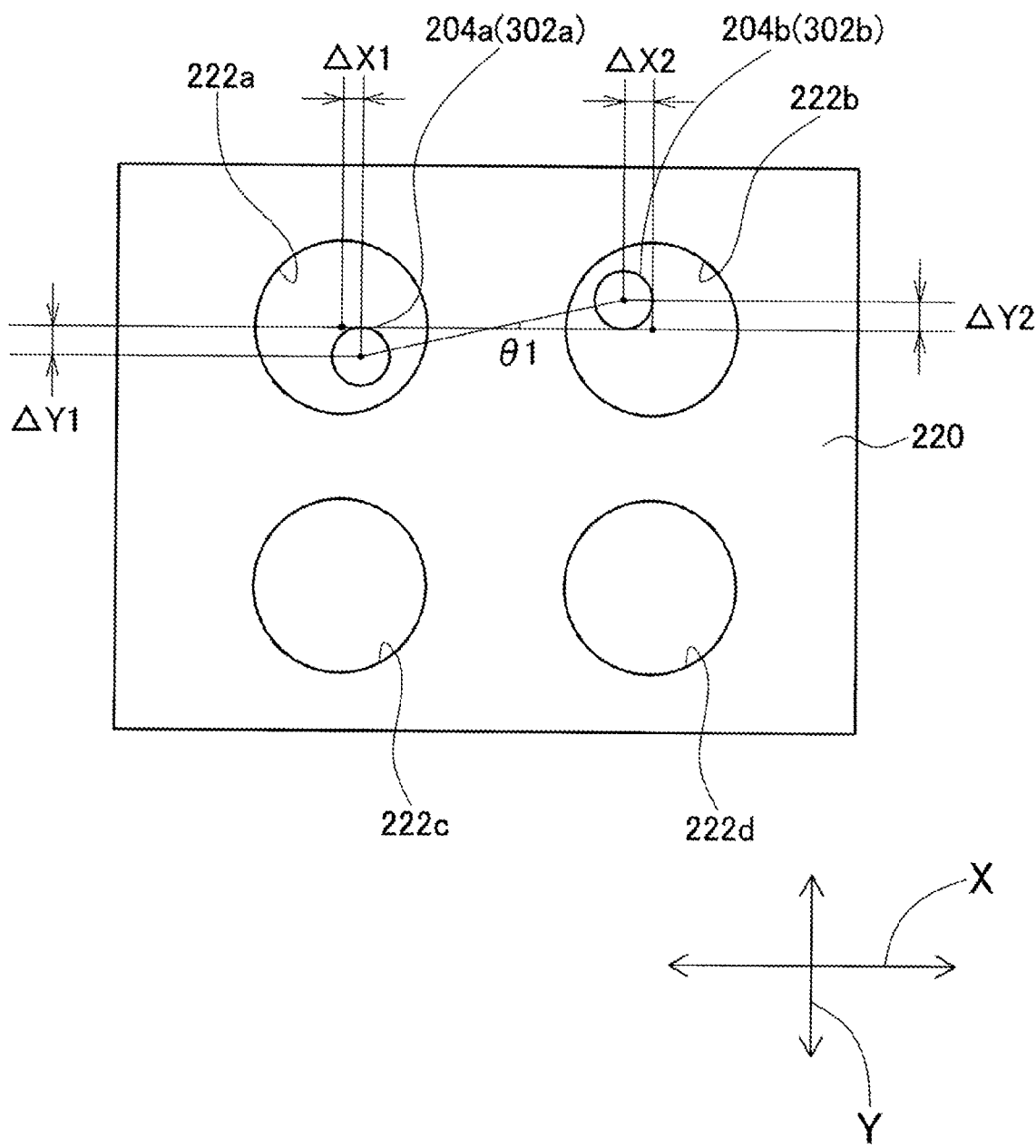
FIG. 10 is a captured image of a through-hole with pins inserted thereinto.

In a case where standardized pins 204 are inserted into standardized through-holes 222 in this manner, an ideal insertion state is a state where pair of pins 204 is inserted into the centers of two through-holes 222. That is, as described above, in a case where two through-holes 222 with pair of pins 204 inserted thereinto are imaged by one imaging device 230, ideally, the centers of pair of pins 204 and the centers of two through-holes 222 coincide with each other without being offset from each other in the imaging data thereof, as illustrated in FIG. 9. However, as illustrated in FIG. 10, there is a case where the centers of pair of pins 204 and the centers of two through-holes 222 are offset from each other because of a slight difference in product accuracy between component mounters, a decrease in insertion accuracy with time caused by use of component mounter 10, or the like.

Therefore, for each component mounter, the control device calculates the position of a pair of through-holes and the shape of a pair of pins based on the position of the pair of through-holes and the shape of the pair of pins, acquires a correction value for appropriately inserting terminals of a component held by a work head into multiple through-holes of a circuit base material, and can appropriately insert the multiple terminals into the multiple through-holes based on the acquired correction value. Therefore, in component mounter 10, the amount of deviation between inserted pins 204 and through-holes 222 is calculated based on imaging data of two through-holes 222 with pair of pins 204 inserted thereinto, and a correction value at the time of inserting the pair of pins into the pair of through-holes is acquired based on the calculated amount of deviation. That is, for example, in a case where the centers of pair of pins 204a and 204b and the centers of two through-holes 222a and 222b are offset from each other as illustrated in FIG. 10, the amount of deviation ($\Delta X1$, $\Delta Y1$) in the XY-directions between the center of first pin 204a and the center of first through-hole 222a and the amount of deviation ($\Delta X2$, $\Delta Y2$) in the XY-directions between the center of second pin 204b and the center of second through-hole 222b are calculated. In addition, the angle of deviation (81) formed by a straight line connecting the center of first pin 204a and the center of second pin 204b and a straight line connecting the center of first through-hole 222a and the center of second through-hole 222b is also calculated.

Figure 11:
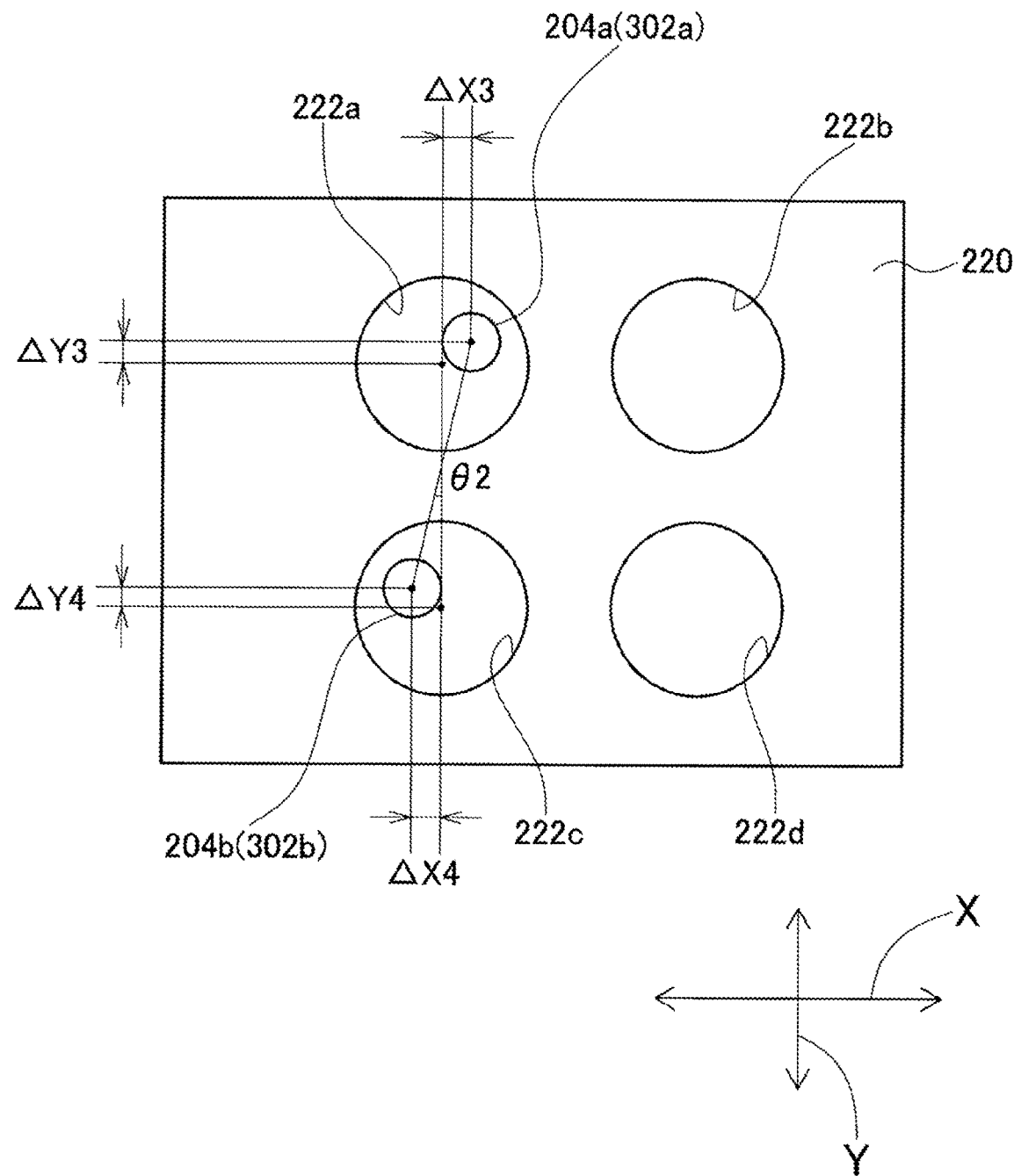
FIG. 11 is a captured image of a through-hole with pins inserted thereinto.

Subsequently, through-holes 222 into which pair of pins 204 is inserted are changed and other pair of through-holes 222 is imaged. For example, component holding tool 77 holding jig 200 is rotated by 90 degrees by the rotation device. Then, according to the above-described procedure, pair of pins 204 is inserted into two through-holes 222. In the case of component holding tool 77 rotated by 90 degrees by the rotation device, since pair of pins 204 of held jig 200 also rotates by 90 degrees, as illustrated in FIG. 11, first pin 204a is inserted into first through-hole 222a and second pin 204b is inserted into second through-hole 222c. Then, pair of pins 204a and 204b and two through-holes 222a and 222c with the pair of pins inserted thereinto are simultaneously imaged by one imaging device 230, and the amount of deviation between pins 204 and through-holes 222 is calculated. That is, the amount of deviation ($\Delta X3$, $\Delta Y3$) in the XY-directions between the center of first pin 204a and the center of first through-hole 222*a* and the amount of deviation (ΔX4, ΔY4) in the XY-directions between the center of second pin 204*b* and the center of second through-hole 222*c* are calculated. In addition, the angle of deviation (θ2) formed by a straight line connecting the center of pair of pins 204*a* and the center of pin 204*b* and a straight line connecting the center of pair of through-holes 222*a* and the center of through-hole 222*c* is also calculated.

Furthermore, through-holes 222 into which pair of pins 204 is inserted are changed and other pair of through-holes 222 is imaged. For example, component holding tool 77 holding jig 200 is further rotated by 90 degrees by a rotation device. Then, according to the above-described procedure, pair of pins 204 is inserted into two through-holes 222. In the case of component holding tool 77 further rotated by 90 degrees by the rotation device, since pair of pins 204 of held jig 200 also rotates by 90 degrees, although not shown, first pin 204*a* is inserted into first through-hole 222*b* and second pin 204*b* is inserted into second through-hole 222*a*. Then, pair of pins 204*a* and 204*b* and two through-holes 222*a* and 222*c* with the pair of pins inserted thereinto are simultaneously imaged from below by one imaging device 230, and the amount of deviation between pins 204 and through-holes 222 is calculated. That is, the amount of deviation in the XY-directions between the center of pin 204*a* and the center of through-hole 222*b* and the amount of deviation in the XY-directions between the center of the pin 204*b* and the center of through-hole 222*a* are calculated. In addition, similarly, an angle formed by a straight line connecting the center of pair of pins 204*a* and the center of pin 204*b* and a straight line connecting the center of pair of through-holes 222*a* and the center of through-hole 222*b* is also calculated.

Similarly, the amount of deviation and the angle of deviation between pins 204 inserted and the through-holes are calculated, and a correction value at the time of inserting a pair of pins into the pair of through-holes is acquired based on the calculated amount of deviation and angle of deviation. By using this correction value, it is possible to insert pair of pins 204*a* and 204*b* into the centers of two through-holes 222*a* and 222*b* as illustrated in FIG. 9, in a case where pair of pins 204*a* and 204*b* is to be inserted into two through-holes 222*a* and 222*b*, for example. In other words, pair of pins 204 can be inserted into two through-holes 222 in a state where the amount of deviation of the pins is zero. As a result, for an actual insertion operation, that is, the component mounter, it is possible to improve the insertion accuracy at the time of inserting pair of leads 108 of lead component 106, of which the component main body has been held by a work head, into pair of through-holes 104 of circuit base material 12 positioned at the work position of the substrate conveyance device.

Note that the imaging of pair of through-holes 222 with pair of pins 204 inserted thereinto, calculation of the amount of deviation and the angle of deviation based on imaging data acquired by the imaging of pair of through-holes 222, acquisition of a correction value for insertion of the pair of pins into the pair of through-holes that is acquired based on the calculated amount of deviation and angle of deviation, or the like is performed at the time of inspection of the accuracy of component mounter 10 or at the time of maintenance, inspection, or the like of component mounter 10 after delivery to a user. As a result, it is possible to stabilize the quality of component mounter 10, avoid problems, maintain the insertion accuracy by periodic maintenance, and the like.

Figure 12:
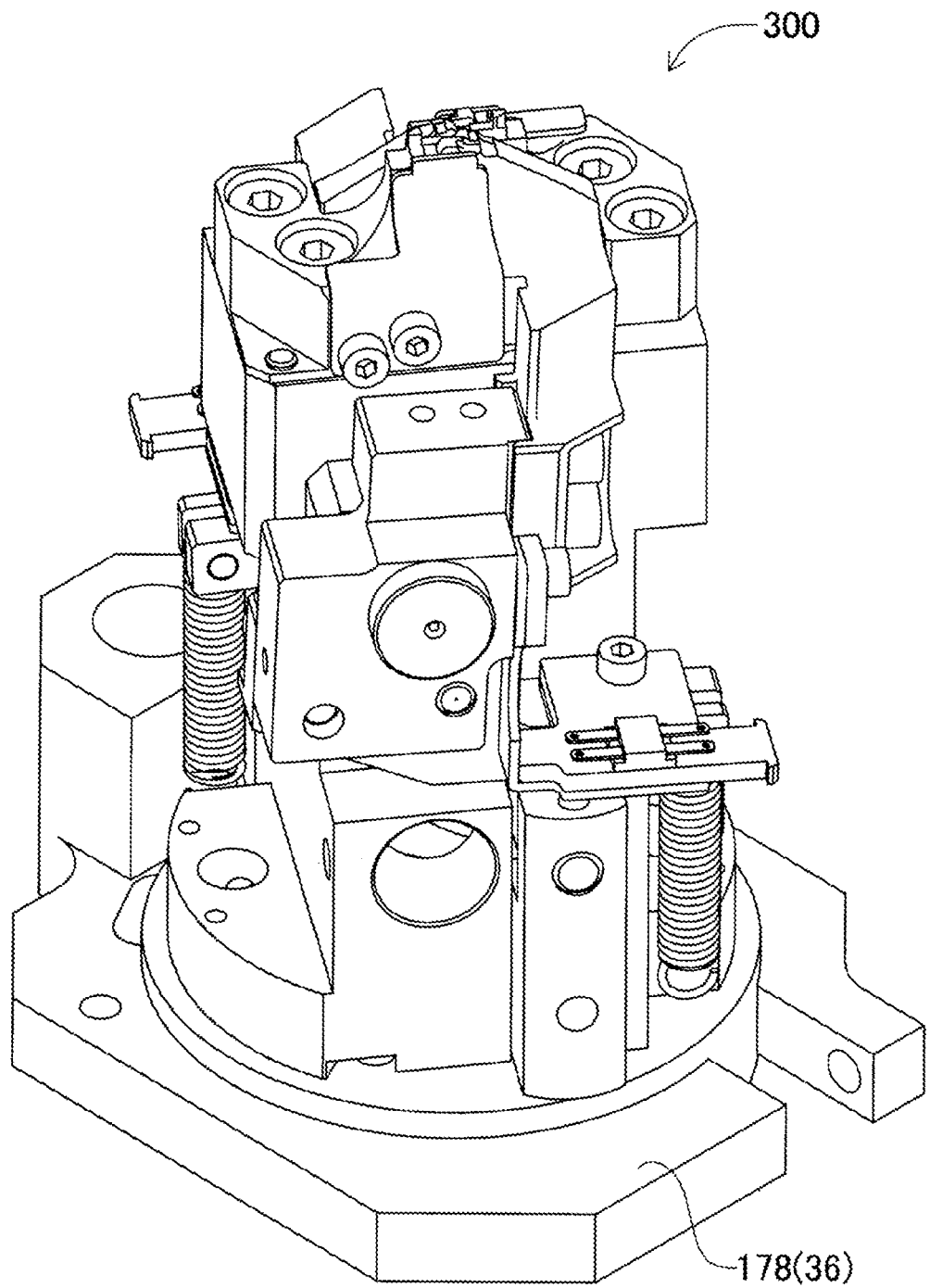
FIG. 12 is a perspective view showing a cut-and-clinch unit.
Figure 13:
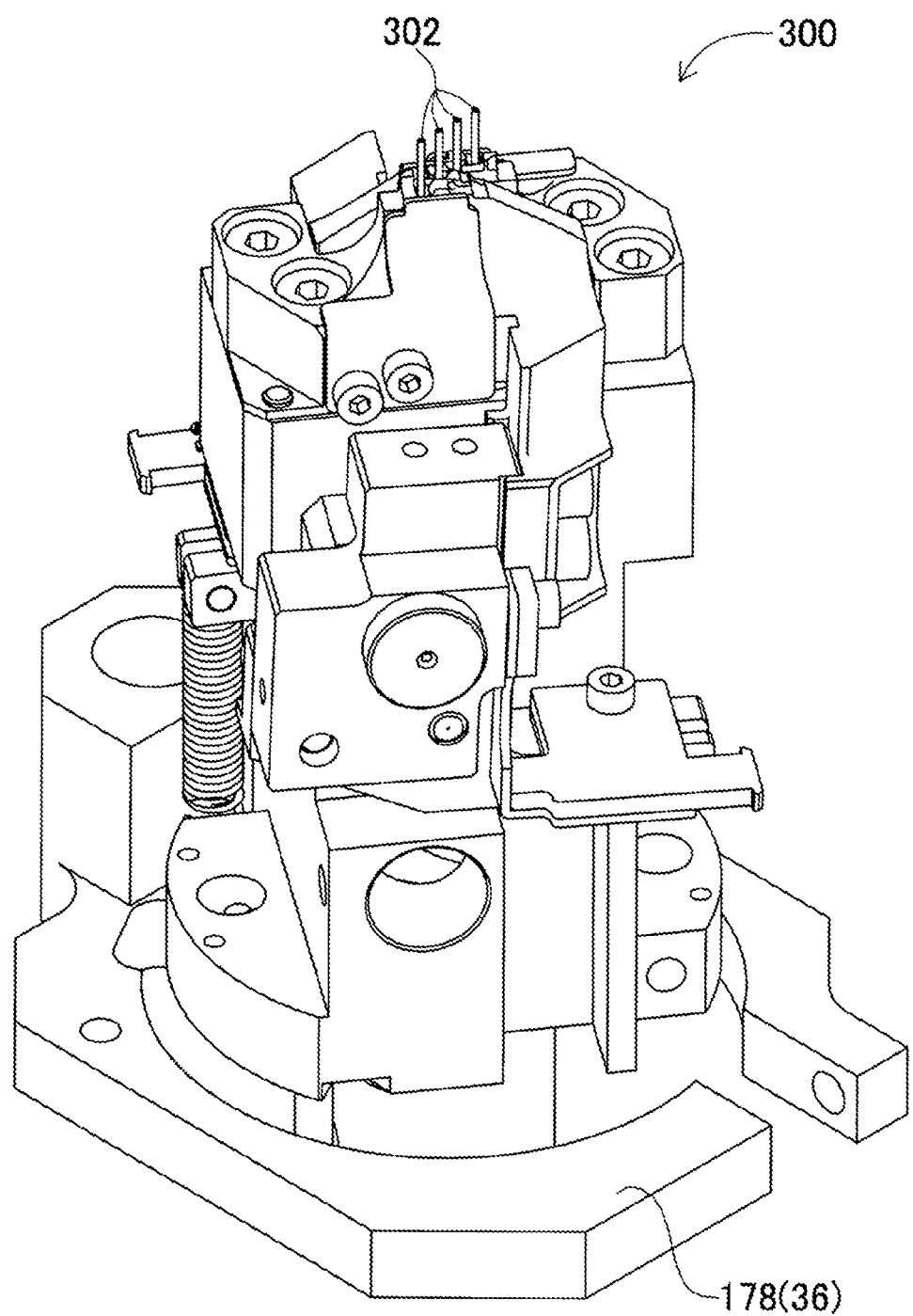
FIG. 13 is a perspective view showing the cut-and-clinch unit.

In addition, in component mounter 10, instead of cut-and-clinch unit 34, it is also possible to attachably and detachably position and attach, to rotary table 178 of unit moving device 36, a lead receiving type cut-and-clinch unit receiving a lead component inserted into an insertion hole of a circuit base material. Lead receiving type cut-and-clinch unit 300 is an existing device and when briefly described, as illustrated in FIGS. 12 and 13, cut-and-clinch unit 300 includes four guide pins 302 that controllably extend from an upper end portion of cut-and-clinch unit 300.

Four guide pins 302 are disposed to extend in the vertical direction and are arranged at equal pitches on one straight line. Each of four guide pins 302 controllably expands and contracts in length, and is stored in the inside of cut-and-clinch unit 300 in the most contracted state. In addition, a cutting device (not illustrated) for cutting leads of a lead component and a bending device (not illustrated) for bending the leads are stored in the inside of cut-and-clinch unit 300. With such a structure, in cut-and-clinch unit 300 as well, it is possible to cut and bend leads of a lead component inserted into through-holes 104 of circuit base material 12.

Specifically, the operation of rotation device 156 is controlled such that the direction of alignment of two through-holes 104 of circuit base material 12 coincides with the direction of alignment of four guide pins 302. Then, by the operation of X-direction moving device 150 and Y-direction moving device 152, cut-and-clinch unit 300 is moved below the circuit base material 12 and the positioning thereof is stopped such that the coordinates in the XY-directions of two through-holes 104 of circuit base material 12 coincide with the coordinates in the XY-directions of distal ends of two of four guide pins 302 that are to be inserted into two of the four through-holes. As a result, cut-and-clinch unit 300 is moved along the XY-directions and two through-holes 104 of circuit base material 12 and the distal ends of two of four guide pins 302 are positioned in a state of overlapping with each other in the up-down direction.

Figure 14:
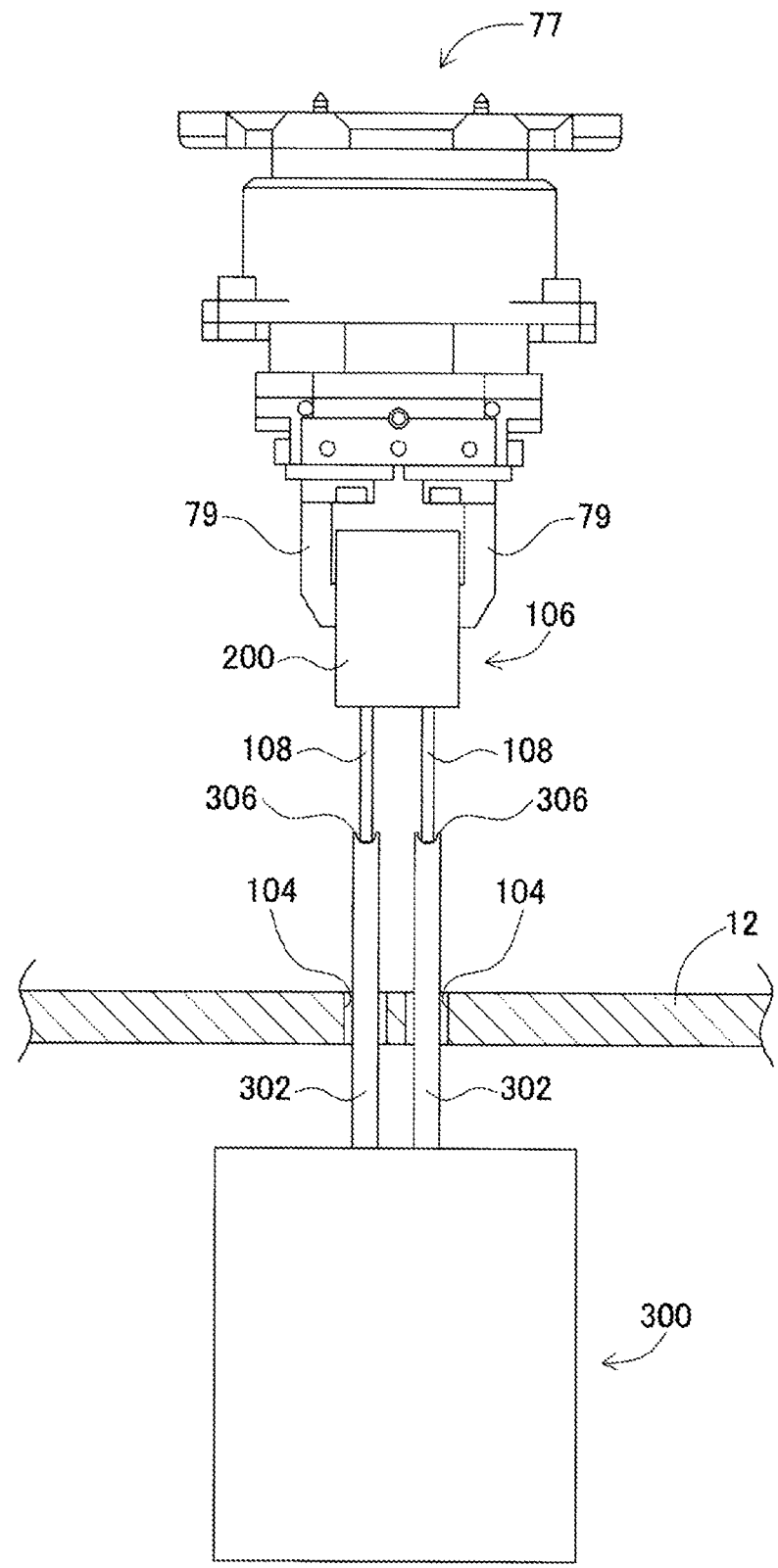
FIG. 14 is a schematic view showing a state where leads of a lead component are inserted into through-holes of a circuit base material by means of the cut-and-clinch unit.

Next, cut-and-clinch unit 300 extends two through-holes 104 of the circuit base material and two of the four guide pins 302 that are in a state of overlapping with the two through-holes in the up-down direction. As a result, as illustrated in FIG. 14, two guide pins 302 are inserted through two through-holes 104 in a direction from a lower side to an upper side and upper ends of two guide pins 302 protrude from the upper surface of circuit base material 12. In addition, recessed portion 306 is formed on an upper end surface of each guide pin, and the operation of work head moving device 64 is controlled such that a lower end of each of leads 108 of lead component 106 is inserted into recessed portion 306. That is, the operations of X-direction moving device 68 and Y-direction moving device 70 are controlled such that the coordinates in the XY-directions of the lower ends of pair of leads 108 of lead component 106 held by component holding tool 77 coincide with the coordinates in the XY-directions of the recessed portions of two guide pins 302 exposed at the upper surface of the circuit base material 12. Then, the operation of Z-direction moving device 72 is controlled such that work heads 60 and 62 are lowered and the lower ends of pair of leads 108 of lead component 106 held by component holding tool 77 are inserted into recessed portions 306 of two guide pins 302 protruding from the upper surface of the circuit base material 12.

Subsequently, cut-and-clinch unit 300 contracts two guide pins 302 protruding and extending from the upper surface of the circuit base material 12. At this time, work heads 60 and 62 are also lowered by the operation of Z-direction moving device 72 at the same speed as the speed of contraction of guide pins 302. As a result, two guide pins 302 contract with the lower ends of pair of leads 108 inserted into recessed portions 306 of two guide pins 302. Then, as guide pins 302 contract, upper end surfaces of guide pins 302, that is, recessed portions 306 pass through through-holes 104 of circuit base material 12 and are stored in the inside of cut-and-clinch unit 300. At this time, the lower ends of pair of leads 108 inserted into recessed portions 306 also pass through pair of through-holes 104 of circuit base material 12 and are stored in the inside of cut-and-clinch unit 300. That is, with the lower ends of pair of leads 108 of lead component 106 guided by pair of guide pins 302, the lower ends of pair of leads 108 are inserted into pair of through-holes 104 of circuit base material 12 and are stored in the inside of cut-and-clinch unit 300. Then, the lower ends of pair of leads 108 stored in the inside of cut-and-clinch unit 300 are cut and bent by the cutting device. As a result, lead component 106 is mounted on circuit base material 12 in a state where leads 108 are prevented from coming out of through-holes 104.

As described above, in the case of cut-and-clinch unit 300, guide pins 302 are extended to be inserted into pair of through-holes 104 from a position below the circuit base material 12 and the distal ends of pair of guide pins 302 protrude from the upper surface of circuit base material 12. Then, guide pins 302 contract with the lower ends of pair of leads 108 of lead component 106 inserted into recessed portions 306 of the distal ends of guide pins 302, the lower ends of pair of leads 108 are stored in the inside of cut-and-clinch unit 300, and the pair of leads are cut and bent. Therefore, although it is desired to suitably insert guide pins 302 into through-holes 104 of circuit base material 12, a method of improving the accuracy of insertion of guide pins 302 has not been established in a conventional component mounter. Therefore, in the case of component mounter 10, similarly to the method of improving the accuracy of insertion of leads 108 into through-holes 104 described above, the accuracy of insertion of guide pins 302 is improved by means of imaging data.

Specifically, first, one imaging device 230 is attached to any of sliders 74 and 76 from which a work head has been removed by means of a mechanism for mounting work heads 60 and 62 instead of any of work heads 60 and 62. As described above, work heads 60 and 62 are positioned and mounted to sliders 74 and 76 respectively such that work heads 60 and 62 can be detached and attached through a one-touch action, and imaging device 230 is positioned and attached to any of sliders 74 and 76 from which work heads 60 and 62 have been removed in a state of facing downward on the vertical line. As described above, imaging device 230 can be attachably and detachably positioned and mounted to rotary table 178 as well and is positioned with high compatibility and attachably and detachably mounted to all of rotary table 178 and sliders 74 and 76.

Similarly to substrate 220 into which pair of pins 204 of jig 200 are inserted, a substrate into which pair of guide pins 302 of cut-and-clinch unit 300 is inserted is also prepared. Here, the description will be made on the assumption that substrate 220 is used not only for jig 200 but also for guide pins 302 of cut-and-clinch unit 300. That is, the pitch of two of four through-holes 222 that are adjacent to each other and the pitch of two of four guide pins 302 of the cut-and-clinch unit that are adjacent to each other are the same as each other, four through-holes 222 being formed in substrate 220. Incidentally, the pitch of two guide pins 302 is a distance between the center of a distal end of first guide pin 302 and the center of a distal end of second guide pin 302. In addition, the inner diameter of one through-hole 222 is approximately three times the outer diameter of one guide pin 302.

Figure 15:
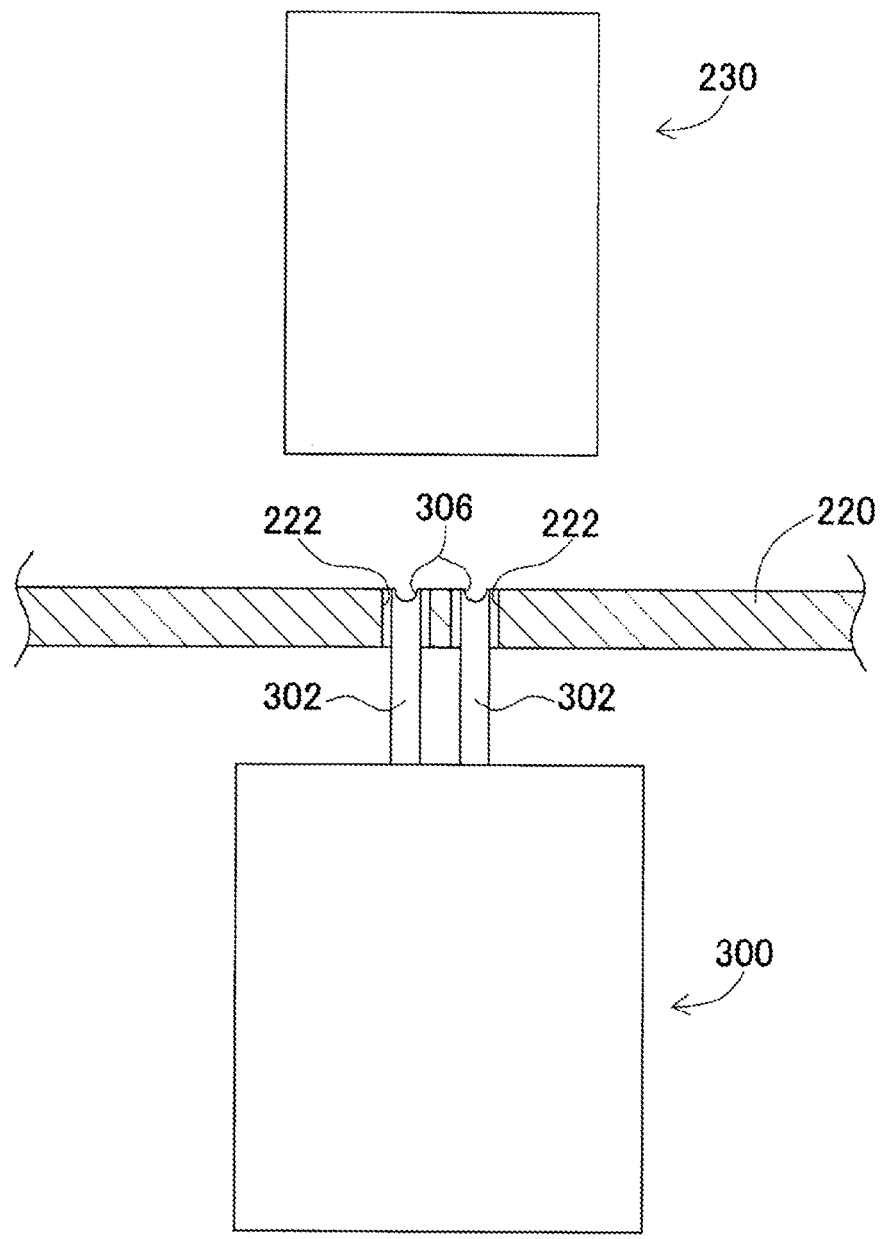
FIG. 15 is a schematic view showing a state where a through-hole with guide pins inserted thereinto is imaged by the imaging device.

Substrate 220 having such a structure is conveyed to a work position by conveyance device 50 and is clamped at the work position by clamp device 52. Then, by imaging device 230 attached to sliders 74 and 76, through-holes of substrate 220 that are adjacent to each other are imaged from above, and the coordinates in the XY-directions of two of four through-holes 222 that are adjacent to each other are calculated based on imaging data thereof. Meanwhile, in the case of cut-and-clinch unit 300 positioned below substrate 220, according to the procedure described above, the cut-and-clinch unit is moved and positioned by the operation of unit moving device 36 such that the distal ends of two of four guide pins 302 that are to be inserted into two of the four through-holes of which the coordinates have been calculated coincide with the calculated coordinates in the XY-directions of two through-holes 222 of the substrate that are adjacent to each other. Cut-and-clinch unit 300 extends two guide pins 302. As a result, two guide pins 302 are inserted into two through-holes 104, of which the coordinates coincide with the coordinates of two guide pins 302, from below. At this time, as illustrated in FIG. 15, cut-and-clinch unit 300 extends guide pins 302 such that the upper end surfaces of guide pins 302 coincide with an upper surface of the substrate 220 in the up-down direction, that is, the upper end surfaces of guide pins 302 and the upper surface of the substrate 220 are flush with each other.

Then, pair of guide pins 302 inserted into two through-holes 222 of substrate 220 positioned within the depth of field of the imaging device is imaged by imaging device 230. In other words, pair of guide pins 302 of the cut-and-clinch unit and two through-holes 222 of the substrate with pair of guide pins 302 inserted thereinto are simultaneously imaged by one imaging device 230 from above. Note that, as described above, imaging device 230 is a two-dimensional imaging device, and the depth of field of imaging device 230 is relatively narrow. Therefore, the upper ends of guide pins 302 inserted into through-holes 222 are positioned to be flush with the upper surface of substrate 220, so that an appropriate captured image of the upper ends of guide pins 302 and through-holes 222 is acquired.

Then, the amount of deviation between inserted guide pins 302 and through-holes 222 is calculated based on imaging data of two through-holes 222 with pair of guide pins 302 inserted thereinto. That is, for example, in a case where first guide pin 302a is inserted into first through-hole 222a and second guide pin 302b is inserted into second through-hole 222b as illustrated in FIG. 10, the amount of deviation ($\Delta X1$, $\Delta Y1$) in the XY-directions between the center of first guide pin 302a and the center of first through-hole 222a and the amount of deviation ($\Delta X2$, $\Delta Y2$) in the XY-directions between the center of second guide pin 302b and the center of second through-hole 222b are calculated. In addition, the angle of deviation ($\theta 1$) formed by a straight line connecting the center of first guide pin 302a and the center of second guide pin 302b and a straight line connecting the center of first through-hole 222a and the center of second through-hole 222b is also calculated.

Subsequently, through-holes 222 into which two guide pins 302 are inserted are changed and other pair of through-holes 222 is imaged. For example, cut-and-clinch unit 300 is rotated by 90 degrees by the operation of rotation device 156 of unit moving device 36. Then, according to the above-described procedure, two guide pins 302 are inserted into two through-holes 222. At this time, as illustrated in FIG. 11, first guide pin 302a is inserted into first through-hole 222a, and second guide pin 302b is inserted into second through-hole 222c. Then, the amount of deviation (ΔX3, ΔY3) in the XY-directions between the center of first guide pin 302a and the center of first through-hole 222a and the amount of deviation (ΔX4, ΔY4) in the XY-directions between the center of second guide pin 302b and the center of second through-hole 222c are calculated. In addition, the angle of deviation (θ2) formed by a straight line connecting the center of first guide pin 302a and the center of second guide pin 302b and a straight line connecting the center of first through-hole 222a and the center of second through-hole 222c is also calculated.

Furthermore, through-holes 222 into which two guide pins 302 are inserted are changed and other pair of through-holes 222 is imaged. For example, cut-and-clinch unit 300 is further rotated by 90 degrees by rotation device 156. Then, according to the above-described procedure, two guide pins 302 are inserted into two through-holes 222. Although not illustrated, first guide pin 302a is inserted into first through-hole 222b, and second guide pin 302b is inserted into second through-hole 222a. Then, the amount of deviation in the XY-directions between the center of first guide pin 302a and the center of first through-hole 222b and the amount of deviation in the XY-directions between the center of second guide pin 302b and the center of second through-hole 222a are calculated. In addition, an angle formed by a straight line connecting the center of first guide pin 302a and the center of second guide pin 302b and a straight line connecting the center of first through-hole 222a and the center of second through-hole 222b is also calculated.

Then, a correction value at the time of inserting pair of guide pins 302 into the pair of through-holes is acquired based on the calculated amount of deviation and angle of deviation. By using this correction value, it is possible to insert two guide pins 302a and 302b into the centers of two through-holes 222a and 222b as illustrated in FIG. 9, in a case where two guide pins 302a and 302b are to be inserted into two through-holes 222a and 222b, as illustrated in FIG. 9, for example. In other words, two guide pins 302 can be inserted into two through-holes 222 in a state where the amount of deviation and the angle of deviation are zero. As a result, it is possible to improve the accuracy of insertion at the time of insertion of guide pins 302 into through-holes 104 of circuit base material 12.

Note that, as with acquisition of a correction value that is performed by using jig 200, the imaging of pair of through-holes 222 with pair of guide pins 302 inserted thereinto, calculation of the amount of deviation and the angle of deviation based on imaging data acquired by the imaging of pair of through-holes 222, acquisition of a correction value for insertion of the pair of guide pins into the pair of through-holes that is acquired based on the calculated amount of deviation and angle of deviation, or the like is performed at the time of inspection of the accuracy of component mounter 10 or at the time of maintenance, inspection, or the like of component mounter 10 after delivery to a user. As a result, it is possible to stabilize the quality of component mounter 10, avoid problems, maintain the insertion accuracy by periodic maintenance, and the like.

Note that component mounter 10 is an example of a substrate working device. Circuit base material 12 is an example of a substrate. Component mounting device 24 is an example of an inserting device. Clamp device 52 is an example of a holding device. Through-hole 104 is an example of a through-hole. Lead component 106 is an example of a component. Lead 108 is an example of a terminal. Jig 200 is an example of a jig. Component main body 202 is an example of a main body. Pin 204 is an example of a pin. Substrate 220 is an example of a substrate. Through-hole 222 is an example of a through-hole. Imaging device 230 is an example of an imaging device. Cut-and-clinch unit 300 is an example of an inserting device. Guide pin 302 is an example of a pin.

In addition, the present disclosure is not limited to the above-described embodiments, and can be implemented in various forms with various changes and improvements based on the knowledge of those skilled in the art. For example, in the above-described embodiment, pair of pins 204 and two through-holes 222 with pair of pins 204 inserted thereinto are simultaneously imaged by one imaging device 230 from a lower side of a vertical axis. In addition, pair of guide pins 302 and two through-holes 222 with pair of guide pins 302 inserted thereinto are simultaneously imaged by one imaging device 230 from an upper side of the vertical axis. Meanwhile, in a case where pair of pins 204 and two through-holes 222 are simultaneously imaged by imaging device 230, the relative positions of the pair of pins and the pair of through-holes and the angle of alignment, that is, the amount of positional deviation and the angle of deviation can be calculated. In addition, in a case where pair of guide pins 302 and two through-holes 222 are simultaneously imaged by imaging device 230, the relative positions of the pair of guide pins and the two through-holes and the angle of alignment, that is, the amount of positional deviation and the angle of deviation can be calculated. That is, an image captured by imaging device 230 simultaneously imaging pair of pins 204 and two through-holes 222 with the pair of pins not inserted thereinto may be acquired, or an image captured by imaging device 230 simultaneously imaging pair of guide pins 302 and two through-holes 222 with the pair of guide pins not inserted thereinto may be acquired. However, both of pair of pins 204 or the distal ends of guide pins 302 and two through-holes 222 need to be in a state of being able to be simultaneously imaged in a viewpoint from one imaging device 230 that is fixedly disposed and need to be not concealed.

In addition, in the above embodiment, component mounting device 24 for inserting pins 204 into through-holes 222 and imaging device 230 for imaging through-holes 222 with the pins inserted thereinto are disposed at opposite positions with respect to substrate 220. In addition, cut-and-clinch unit 300 for inserting guide pins 302 into through-holes 222 and imaging device 230 for imaging through-holes 222 with the guide pins inserted thereinto are disposed at opposite positions with respect to substrate 220. Meanwhile, both of component mounting device 24 and imaging device 230 may be disposed above substrate 220 and both of cut-and-clinch unit 300 and imaging device 230 may be disposed below substrate 220. That is, in a case where pins 204 are inserted from a position above the substrate 220, through-holes 222 with pins 204 inserted thereinto may be imaged above substrate 220 at an angle offset from the vertical axis. In addition, in a case where guide pins 302 are inserted from a position below the substrate 220, through-holes 222 with guide pins 302 inserted thereinto may be imaged below substrate 220 at an angle offset from the vertical axis.

In addition, although pins 204 of jig 200 extend linearly and vertically from component main body 202 in the above embodiment, pins 204 may be bent or extend from the component main body in a state of being inclined as long as pins 204 are standardized pins, that is, as long as the positions of the pins are known in advance. Although component holding tool 77 grips component main body 202 of jig 200 in the above embodiment, component holding tool 77 may grip a pin. In addition, a jig without a component main body may be adopted. For example, a rod-shaped member may be bent into a U-shape, both ends of the member may be used as substitutes for a pair of pins, and the member may be gripped by a component holding tool and used as a jig. A correction value at the time of acquisition with the component holding tool gripping the pins as described above is used as a correction value used when the component holding tool grips pins of a component and inserts the pins into through-holes of a circuit substrate. In other words, a jig including a pin that is not standardized may be adopted. However, in a case where a jig including a pin that is not standardized is used, it is necessary to image the pin with an imaging device to recognize the position of the pin. In other words, it is possible to use commercially available lead component 106 as jig 200 without using a standardized jig.

In addition, although through-holes 222 are imaged with substantial pins 204 inserted into through-holes 222 in the above embodiment, insubstantial pins (for example, illustrations of pins printed on the jig), holes processed in the jig, or the like may be used instead as substitutes for the pins of the jig. In such a case, for example, illustrations or the like of a linear shape or a rod shape resembling a pin, a lead, or the like may be printed on the component main body of the jig, a pair of holes may be drilled in the component main body of the jig, and the illustrations or the holes and through-holes 222 may be simultaneously imaged for acquisition of a correction value. That is, whether the pins are substantial does not matter as long as shapes, from which the shapes of the pins can be figured out (in other words, shapes of the pins), and images of through-holes 222 are simultaneously captured by imaging device 230. As described above, jigs of various shapes can be adopted. In addition, various types of component holding tools such as a suction nozzle picking up a main body may be adopted depending on the shape of the jig.

Although the amount of deviation between the center of pin 204 or the guide pin and the center of through-hole 222 is calculated in the above embodiment, various values based on imaging data may be calculated instead of the amount of deviation between the centers as long as the relative positions of pin 204 or the guide pin and through-hole 222 can be figured out. For example, the distance between an inner wall of through-hole 222 and an external line of the lower end surface of pin 204 may be calculated. Note that the same applies to the relative positions of guide pin 302 and through-hole 222.

Although one piece of two-dimensional image data captured by one two-dimensional imaging device is used in the above embodiment, imaging data captured by another type of imaging device (for example, a stereo camera, a video camera, and a three-dimensional camera) or multiple imaging devices may be used. In addition, imaging data captured by a stereo camera, a video camera, and a three-dimensional camera may be intentionally converted into two-dimensional imaging data and the two-dimensional imaging data may be used.

In addition although an operation of mounting a radial component as lead component 106 has been described in the above embodiment, the present disclosure can also be applied to an axial component. In addition, the present disclosure is not limited to a lead component, and can be applied to a component including a terminal to be inserted into through-hole 222.

REFERENCE SIGNS LIST

10: component mounter (substrate working machine), 12: circuit base material (substrate), 24: component mounting device (inserting device), 52: clamp device (holding device), 104: through-hole, 106: lead component (component), 108: lead (terminal), 200: jig, 202: component main body (main body), 204: pin, 220: substrate, 222: through-hole, 230: imaging device, 300: cut-and-clinch unit (inserting device), 302: guide pin (pin)

The invention claimed is:
1. A substrate working machine comprising:
a base material conveyance and holding device configured to convey and hold a substrate in which multiple through-holes are formed, the base material conveyance and holding device including a conveyance device and a clamp device;
an component mounting device configured to insert multiple terminals of a component into the multiple through-holes of the substrate held by the base material conveyance and holding device, the component mounting device including a work head and a work head moving device;
a jig configured to be held by the component mounting device, the jig including a main body and a pair of pins extending from the main body, a shape of the pair of pins being standardized; and
a camera configured to simultaneously image the pair of pins and a pair of through-holes of the multiple through-holes; and
a controller including a processor configured to
control the component mounting device so that XY-coordinates of the pair of pins of the jig held by the component mounting device coincide with XY-coordinates of first and second through-holes of the multiple through-holes of the substrate, and end surfaces of the pair of pins are flush with a lower surface of the substrate in an up-down direction, and control the camera to acquire a first image data,
control the component mounting device so that XY-coordinates of the pair of pins of the jig coincide with XY-coordinates of one of the first or second through-holes and a third through-hole of the multiple through-holes of the substrate, and end surfaces of the pair of pins are flush with a lower surface of the substrate in an up-down direction, and control the camera to acquire a second image data,
calculate positions of the first, second, and third through-holes and the shape of the pair of pins based on the acquired first and second image data captured by the camera,
calculate translational and angular deviation amounts between centers of the first and second through-holes and centers of the pair of pins, and centers of the one of the first or second through-holes and the third through-hole and centers of the pair of pins, calculate a correction value for inserting multiple terminals of a component into the multiple through-holes of the substrate by the component supply device based on the calculated deviation amounts, and control the component supply device to insert multiple terminals of a component into the multiple through-holes of the substrate based on the correction value.
2. The substrate working machine according to claim 1, wherein the image data is two-dimensional image data.

3. A method comprising:

providing the substrate working machine according to claim 1;

providing a substrate;

controlling the component mounting device so that XY-coordinates of the pair of pins of the jig held by the component mounting device coincide with XY-coordinates of first and second through-holes of the multiple through-holes of the substrate, and end surfaces of the pair of pins are flush with a lower surface of the substrate in an up-down direction, and controlling the camera to acquire a first image data;

controlling the component mounting device so that XY-coordinates of the pair of pins of the jig coincide with XY-coordinates of one of the first or second through-holes and a third through-hole of the multiple through-holes of the substrate, and end surfaces of the pair of pins are flush with a lower surface of the substrate in an up-down direction, and controlling the camera to acquire a second image data;

calculating positions of the first, second, and third through-holes and the shape of the pair of pins based on the acquired first and second image data captured by the camera;

calculate translational and angular deviation amounts between centers of the first and second through-holes and centers of the pair of pins, and centers of the one of the first or second through-holes and the third through-hole and centers of the pair of pins calculate a correction value for inserting multiple terminals of a component into the multiple through-holes of the substrate by the component supply device based on the calculated deviation amounts, and control the component supply device to insert multiple terminals of a component into the multiple through-holes of the substrate based on the correction value.

* * * * *